US008895446B2

United States Patent
(12) United States Patent
Peng et al.

(10) Patent No.: US 8,895,446 B2
(45) Date of Patent: Nov. 25, 2014

(54) FIN DEFORMATION MODULATION

(71) Applicant: Taiwan Semiconductor Manufacturing Company, Ltd., Hsin-Chu (TW)

(72) Inventors: Chih-Tang Peng, Zhubei (TW); Tai-Chun Huang, Hsin-Chu (TW); Hao-Ming Lien, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/769,783

(22) Filed: Feb. 18, 2013

(65) Prior Publication Data

US 2014/0231919 A1 Aug. 21, 2014

(51) Int. Cl.

| | |
|---|---|
| ***H01L 21/302*** | (2006.01) |
| ***H01L 21/461*** | (2006.01) |
| ***H01L 27/088*** | (2006.01) |
| ***H01L 21/762*** | (2006.01) |

(52) U.S. Cl.

CPC ...... *H01L 21/76224* (2013.01); *H01L 27/0886* (2013.01)

USPC ........... 438/700; 438/680; 438/706; 438/745; 438/587; 257/E21.006; 257/E21.014; 257/E21.027; 257/E21.058; 257/E21.077; 257/E21.17; 257/E21.227; 257/E21.229; 257/E21.244; 257/E21.267; 257/E21.304; 257/E21.311; 257/E21.546

(58) Field of Classification Search

USPC ......... 438/270, 700, 311, 502, 552, 587, 513, 438/680, 692, 679, 769, 706, 745; 257/E21.006, E21.014, E21.027, 257/E21.058, E21.077, E21.17, E21.227, 257/E21.229, E21.244, E21.267, E21.304, 257/E21.311, E21.546

See application file for complete search history.

(56) References Cited

U.S. PATENT DOCUMENTS

| | | | | |
|---|---|---|---|---|
| 6,037,018 A * | 3/2000 | Jang et al. | ..................... | 427/579 |
| 6,100,163 A * | 8/2000 | Jang et al. | ..................... | 438/437 |
| 6,387,764 B1 * | 5/2002 | Curtis et al. | .................. | 438/296 |
| 7,276,417 B2 * | 10/2007 | Tseng et al. | .................. | 438/296 |

* cited by examiner

*Primary Examiner* — David Nhu
(74) *Attorney, Agent, or Firm* — Slater & Matsil, LLP

(57) ABSTRACT

A method includes forming a plurality of trenches extending from a top surface of a semiconductor substrate into the semiconductor substrate, with semiconductor strips formed between the plurality of trenches. The plurality of trenches includes a first trench and second trench wider than the first trench. A first dielectric material is filled in the plurality of trenches, wherein the first trench is substantially fully filled, and the second trench is filled partially. A second dielectric material is formed over the first dielectric material. The second dielectric material fills an upper portion of the second trench, and has a shrinkage rate different from the first shrinkage rate of the first dielectric material. A planarization is performed to remove excess second dielectric material. The remaining portions of the first dielectric material and the second dielectric material form a first and a second STI region in the first and the second trenches, respectively.

20 Claims, 11 Drawing Sheets

FIN DEFORMATION MODULATION

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins.

Since the aspect ratio of the gaps between the fins becomes increasingly greater, in the gap filling for forming the STI regions, materials with high shrinkage rates are often used. The high-shrinkage-rate materials shrink significantly when annealed. This causes significant stresses applied on the fins, and hence the fins may have deformation and cracking.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Shallow Trench Isolation (STI) regions, Fin Field-Effect Transistors (FinFETs), and the methods of forming the same are provided. The intermediate stages in the formation of the STI regions and the FinFETs are illustrated in accordance with exemplary embodiments. The variations of the embodiment are discussed. Throughout the various views and illustrative embodiments, like reference numbers are used to designate like elements.

Figure 1:
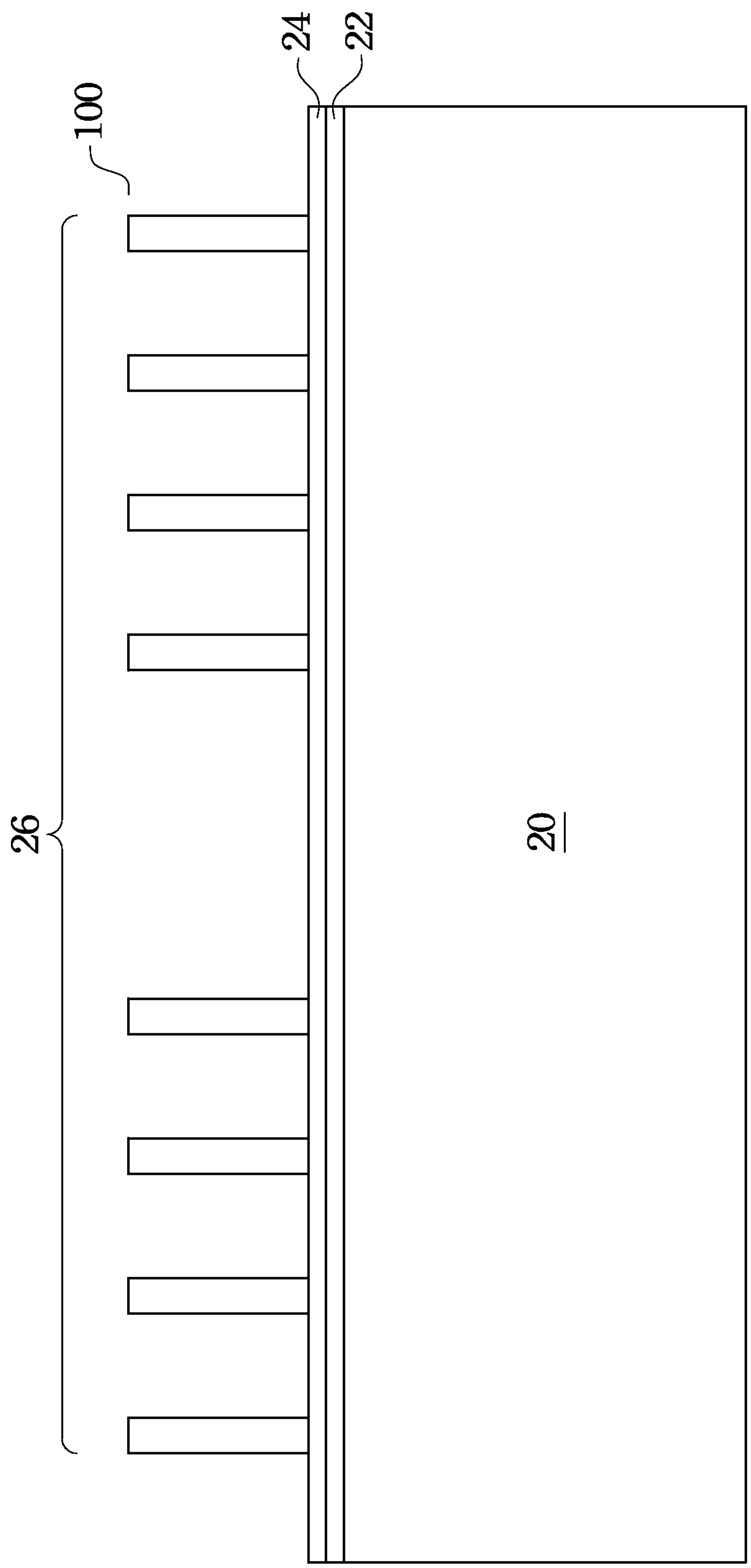
FIGS. 1 through 11 are cross-sectional views of intermediate stages in the manufacturing of semiconductor fins and FinFETs in accordance with some exemplary embodiments.

Referring to FIG. 1, semiconductor substrate 20, which is a part of semiconductor wafer 100, is provided. In some embodiments, semiconductor substrate 20 includes crystalline silicon. Other commonly used materials, such as carbon, germanium, gallium, boron, arsenic, nitrogen, indium, phosphorus, and/or the like, may also be included in semiconductor substrate 20. Semiconductor substrate 20 may be a bulk substrate or a Semiconductor-On-Insulator (SOI) substrate.

Pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In some embodiments, mask layer 24 is formed of silicon nitride, for example, using Low-Pressure Chemical Vapor Deposition (LPCVD). In other embodiments, mask layer 24 is formed by thermal nitridation of silicon, Plasma Enhanced Chemical Vapor Deposition (PECVD), or plasma anodic nitridation. Mask layer 24 is used as a hard mask during subsequent photolithography processes. Photo resist 26 is formed on mask layer 24 and is then patterned.

Figure 2:
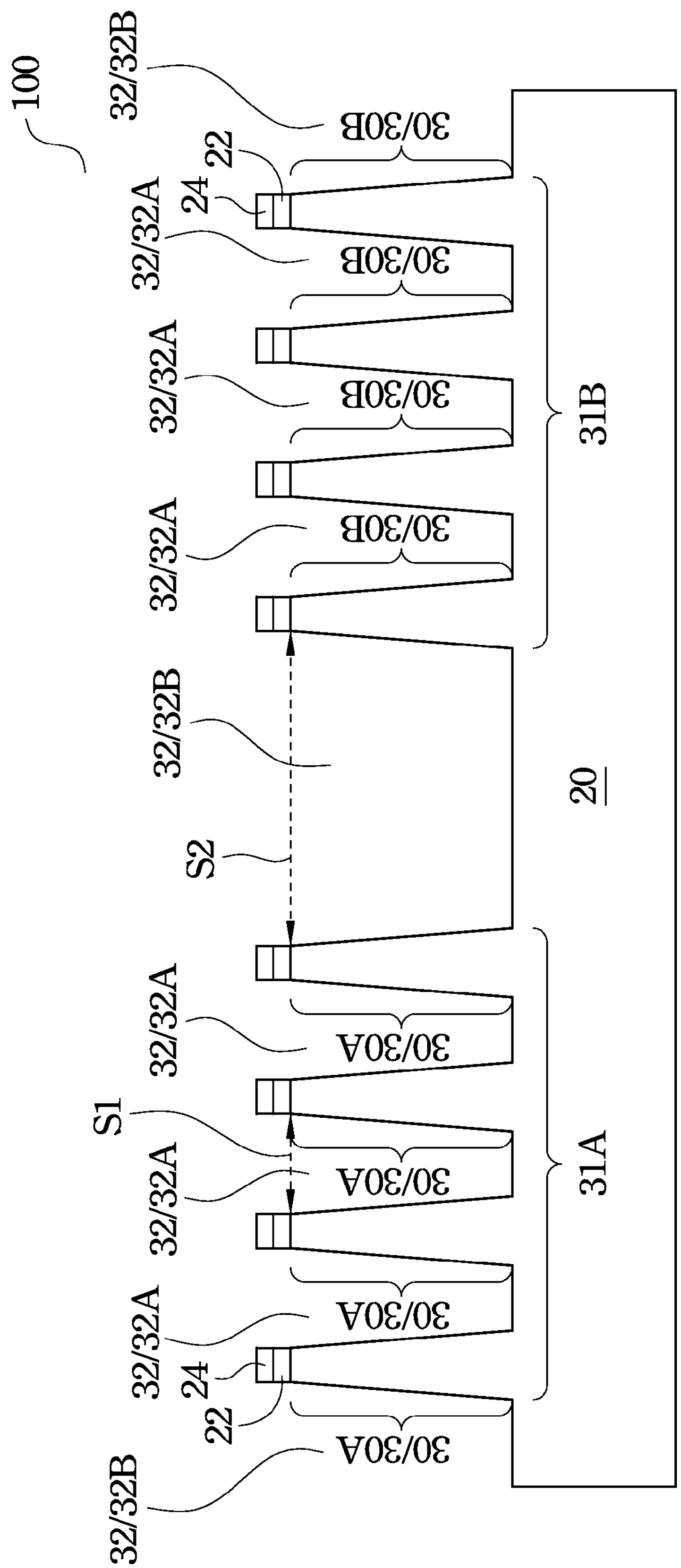

Referring to FIG. 2, mask layer 24 and pad layer 22 are etched through photo resist 26, exposing underlying semiconductor substrate 20. The exposed semiconductor substrate 20 is then etched, forming trenches 32 (including 32A and 32B). The portions of semiconductor substrate 20 between neighboring trenches 32 form semiconductor strips 30 (including 30A and 30B). Trenches 32 may be strips (when viewed in the top view of wafer 100) that are parallel to each other. After the etching of semiconductor substrate 20, photo resist 26 (FIG. 1) is removed. Next, a cleaning step may be performed to remove a native oxide of semiconductor substrate 20. The cleaning may be performed using diluted hydrofluoric (HF) acid, for example.

Trenches 32 include trenches 32A, and 32B that have lateral sizes different from that of trenches 32A. Some semiconductor strips 30 may be closely located, so that they may be used to form the semiconductor fins of a same FinFET. For example, semiconductor strips 30A are closely located from each other, and semiconductor strips 30B are closely located from each other. Throughout the description, semiconductor strips 30A are in combination referred to as strip group 31A, and semiconductor strips 30B are in combination referred to as strip group 31B. The inner spacing S1 (the lateral size of trenches 32A) between strips 30A may be smaller than about 30 nm, or further smaller than about 20 nm in accordance with some embodiments. It is appreciated, however, that the values recited throughout the description are merely examples, and may be changed to different values. The inter spacing S2 (the lateral size of trenches 32A) between strip groups 31A and 31B may be greater than about 80 nm, or further greater than about 300 nm in accordance with some embodiments. Ratio S2/S1 may be greater than about 10 in accordance with some embodiments.

Figure 3:
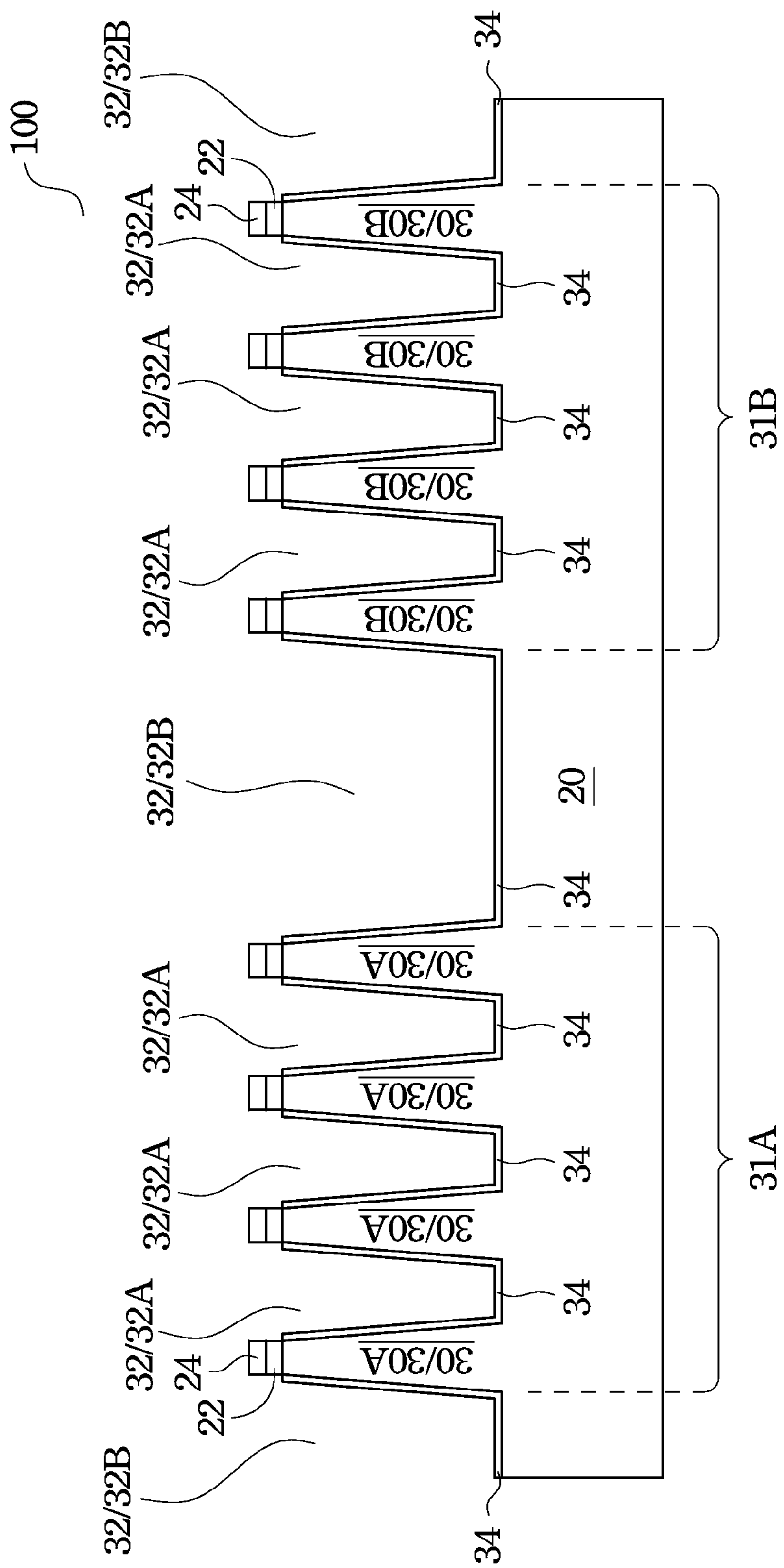

In accordance with some embodiments, liner oxide 34 is formed in trenches 32 and on the sidewalls of semiconductor strips 30, as is shown in FIG. 3. Liner oxide 34 may be a conformal layer whose horizontal portions and vertical portions have thicknesses close to each other. Liner oxide 34 may be a thermal oxide (such as silicon dioxide) having a thickness between about 10 Å and about 40 Å. In some embodiments, liner oxide 34 is formed by oxidizing wafer 100 in an oxygen-containing environment, for example, through Local Oxidation of Silicon (LOCOS), wherein oxygen ($O_2$) may be included as the process gas. In other embodiments, liner oxide 34 is formed using In-Situ Steam Generation (ISSG), with water steam or a combined gas of hydrogen ($H_2$) and oxygen ($O_2$) used to oxidize semiconductor strips 30, The ISSG oxidation may be performed at an elevated temperature. In yet other embodiments, liner oxide 34 may be formed using a deposition technique such as Selective Area Chemical Vapor Deposition (SACVD). The formation of liner oxide 34 may result in the rounding of the corners of trenches 32, which reduces the electrical fields of the resulting FinFETs, and hence improves the performance of the resulting integrated circuit. In alternative embodiments, the formation of liner oxide 34 is skipped.

Figure 4:
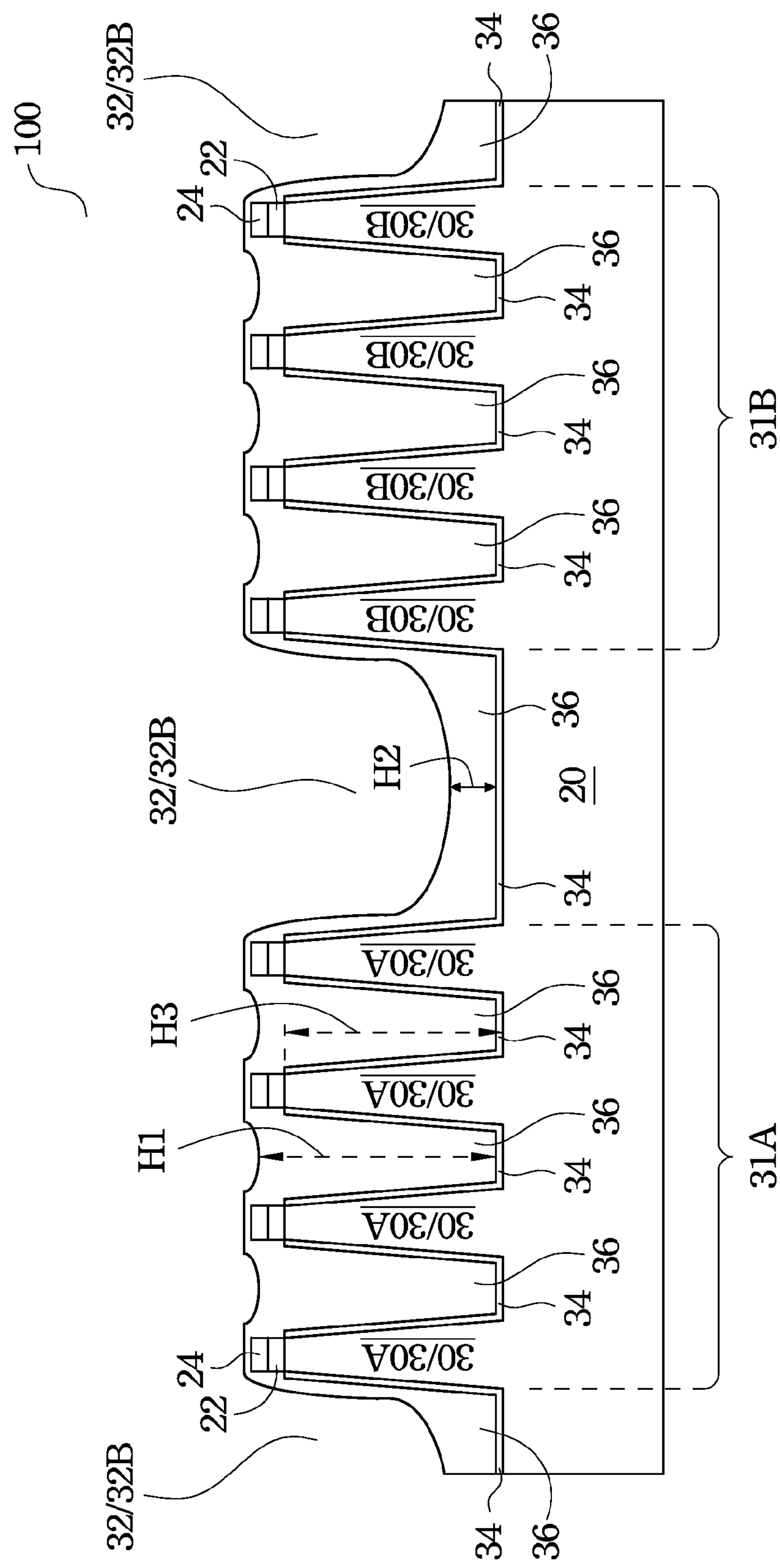

FIG. 4 illustrates the formation of dielectric region 36. Dielectric region 36 substantially fully fills trenches 32A (FIG. 3). On the other hand, the bottom portions of trenches 32B are filled with dielectric region 36, and the top portions of trenches 32B remain unfilled. The filling methods may be selected from spin-on, Flowable Chemical Vapor Deposition (FCVD), and the like. Dielectric region 36 may include highly-flowable materials, which tend to fill narrow trenches 32A to a higher level than wide trenches 32B. In some embodiments, the top surfaces of the portions of dielectric regions 36 in trenches 32A are substantially level with, or higher than, the top surfaces of semiconductor strips 30. Height H1 of the portions of dielectric material 36 filling trenches 32A may also be greater than about 70 percent, or greater than about 90 percent, height H3 of semiconductor strips 30. Height H2 of the portions of dielectric material 36 in trenches 32B, on the other hand, may also be smaller than about 50 percent, or smaller than about 30 percent, height H3 of semiconductor strips 30. Height H1 may be the height of the lowest point of the portion of dielectric region 36 that fills the respective trench 32A, and Height H2 may be the height of the lowest point of the portion of dielectric region 36 that fills the respective trench 32B.

In some embodiments, dielectric region 36 comprises spin-on glass, which may include Si—O—N—H. In alternative embodiments, dielectric region 36 comprises flowable oxide, which may include Si—O—N—H, Si—C—O—N—H, or the like. Highly-flowable materials tend to (although not necessarily) have a high shrinkage rate. Hence, dielectric region 36 may have a high shrinkage rate when cured, annealed, and/or solidified. In some embodiments, dielectric region 36 has a shrinkage rate greater than about 10 percent, or between about 10 percent and about 30 percent. In other embodiments, dielectric material 36 has a small shrinkage rate, for example, smaller than about 10 percent, or smaller than about 5 percent, when cured, annealed, and/or solidified.

Figure 5:
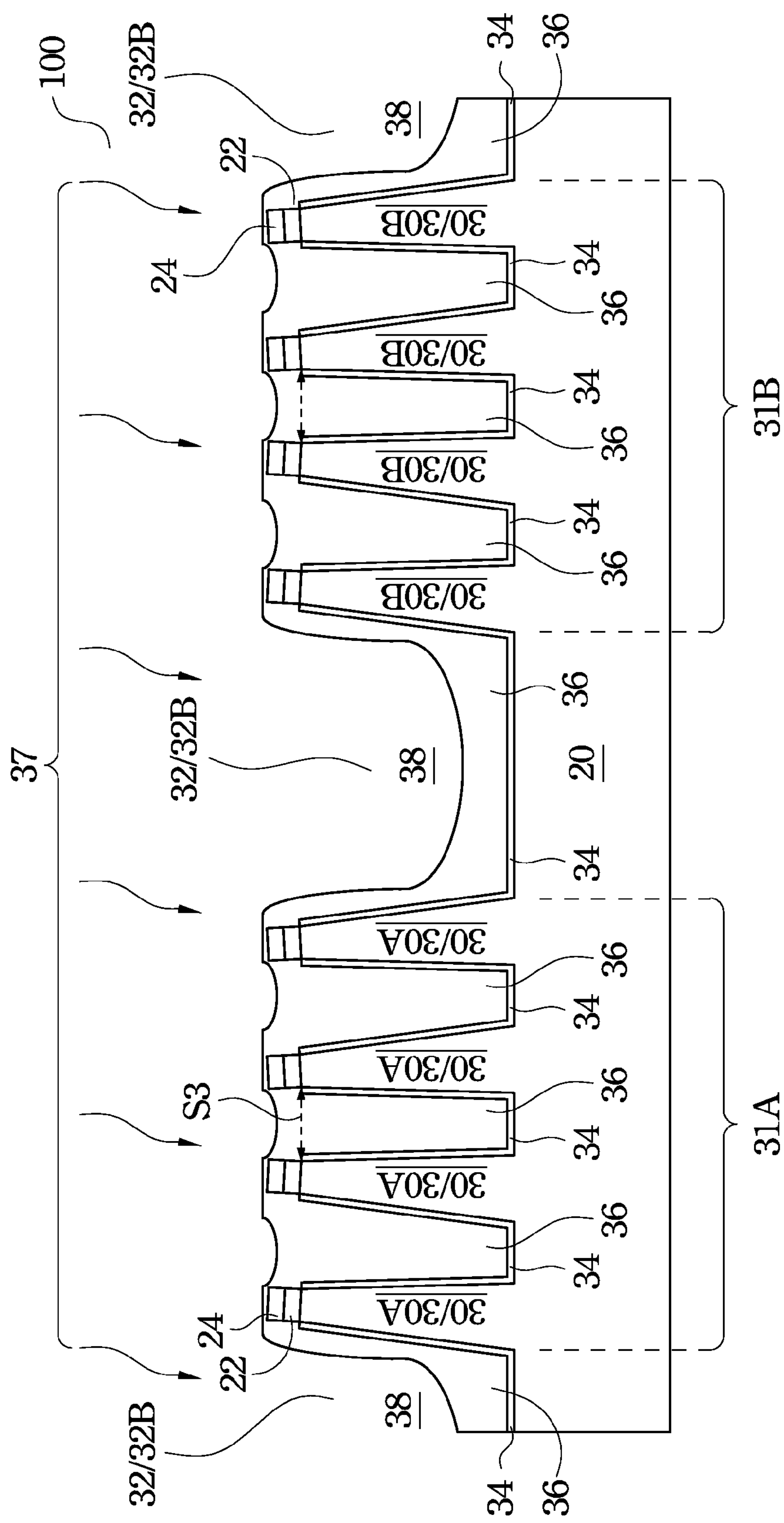

Referring to FIG. 5, an anneal step (represented by arrows 37) is performed on wafer 100. Dielectric material 36 is solidified as a result of the anneal. In alternative embodiments, dielectric material 36 is solidified by a curing process separate from the anneal. In some embodiments, the anneal is performed at a temperature between about 500° C. and about 1,200° C., although different temperatures may be used. The anneal step may be performed for a period of time between about 30 minutes and about 120 minutes, for example. As a result of the anneal step, dielectric material 36 may shrink, and the spacing between semiconductor strips 30 may be reduced to S3, which may be smaller than spacing S1 (FIG. 2) by about 3 percent to about 6 percent, for example. FIG. 5 schematically illustrates that due to the shrinkage of dielectric material 36, semiconductor strips 30 in the same strip group 31A (and 31B) are slightly bended toward the center of the respective strip group. Since the wide trenches 32B are partially filled, the bending of semiconductor strips 30 may be significantly less severe than if trenches 32B are fully filled. Furthermore, since wide trenches 32B are not filly filled, the pulling force caused by the shrinkage rate of dielectric regions 36 in trenches 32B is much smaller. Also, semiconductor strips 30 in the same strip group 31A and 31B may be bended inwardly toward the center of the respective strip group, rather than bended outwardly.

In some embodiments, depending on what material is comprised in dielectric regions 36 before the anneal step, and further depending on the process conditions of the anneal step, after the anneal, dielectric regions 36 may comprise Si, N, O, and H atoms.

Figure 6:
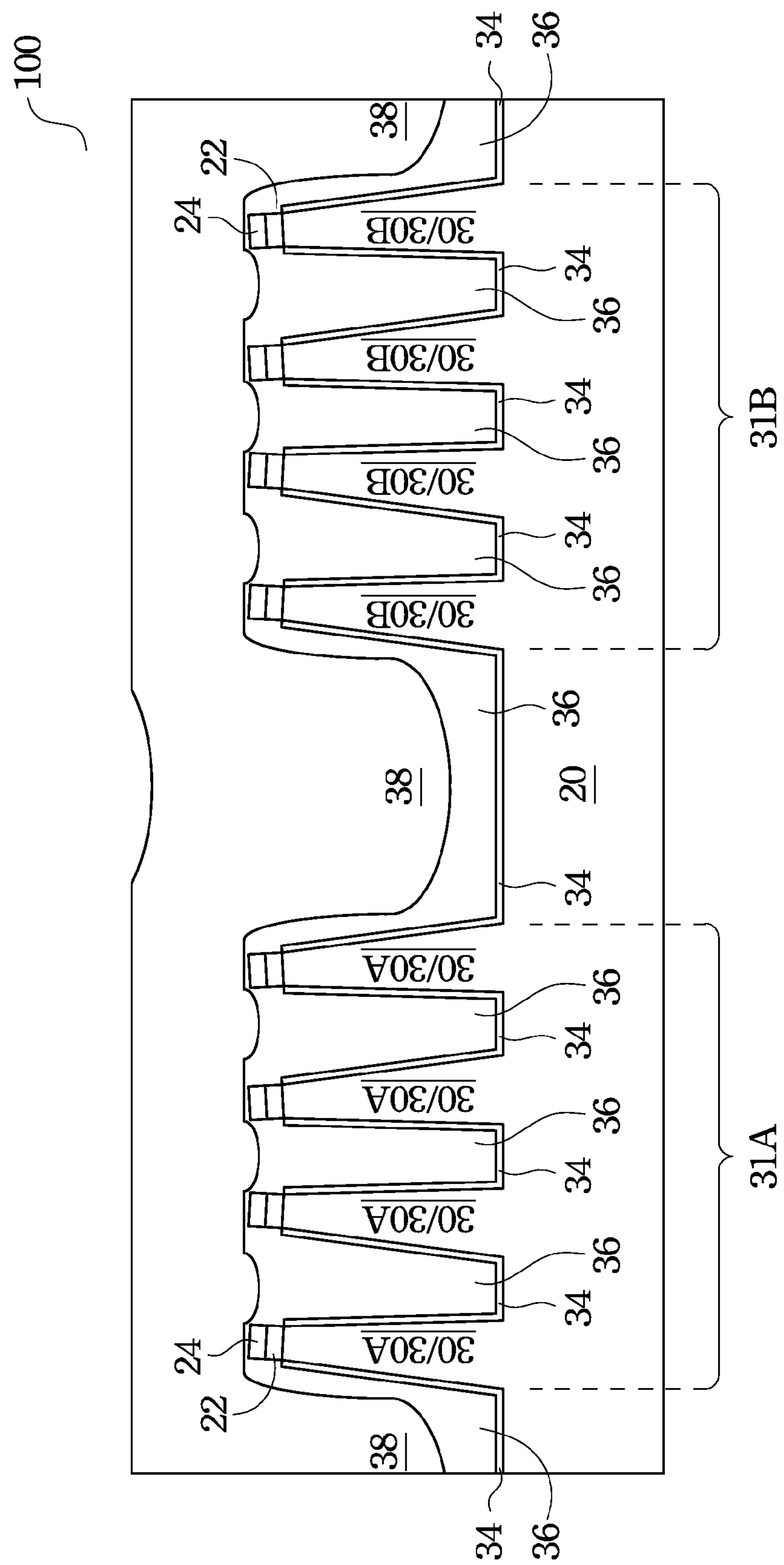

Next, referring to FIG. 6, the remaining portions of trenches 32 are filled with a dielectric material to form dielectric region 38. The top surface of dielectric region 38 is higher than the top surface of mask layer 24. Dielectric region 38 may be formed of a material that has shrinkage rate lower than the shrinkage rate of dielectric region 36. In some exemplary embodiments, the shrinkage rate of dielectric region 38, when annealed and/or solidified, may be between about 1 percent and about 5 percent. Dielectric region 38 may be non-flowable at the time it is formed (before any annealing or curing), although it may also be flowable in accordance with alternative embodiments. Dielectric region 38 may include silicon oxide, and other dielectric materials, such as SiN, SiC, or the like, may also be used. In some embodiments, dielectric region 38 is formed using High Aspect-Ratio Process (HARP), High-Density Plasma CVD (HDPCVD), or the like. In the deposition of dielectric region 38, the respective process gases may include tetraethylorthosilicate (TEOS) and $O_3$ (ozone). Dielectric regions 36 and 38, after being annealed, may be formed of a same material or different materials.

Figure 7:
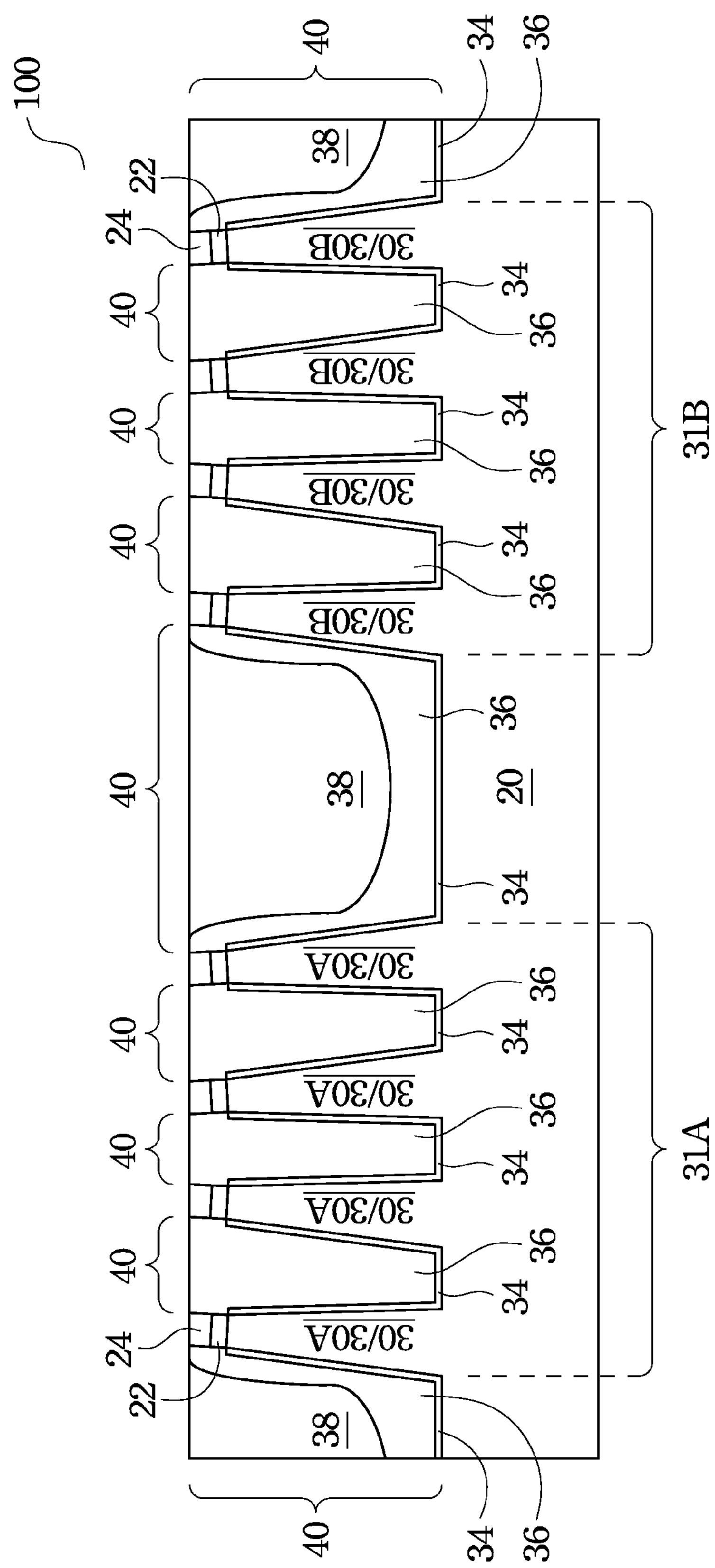

A planarization such as Chemical Mechanical Polish (CMP) is then performed, as shown in FIG. 7, and hence STI regions 40 are formed. STI regions 40 comprise the remaining portions of liner oxide 34, dielectric layer 36, and dielectric region 38. After the CMP, dielectric layer 36 and dielectric region 38 may include a plurality of discrete portions, which are referred to hereinafter as dielectric regions 36 and dielectric regions 38, respectively. Mask layer 24 is used as the CMP stop layer, and hence the top surface of mask layer 24 is substantially level with the top surface of dielectric regions 38 and the top surfaces of dielectric regions 36. Furthermore, the discrete portions of liner oxide layer 34 are referred to as liner oxide layers 34 hereinafter.

Figure 8:
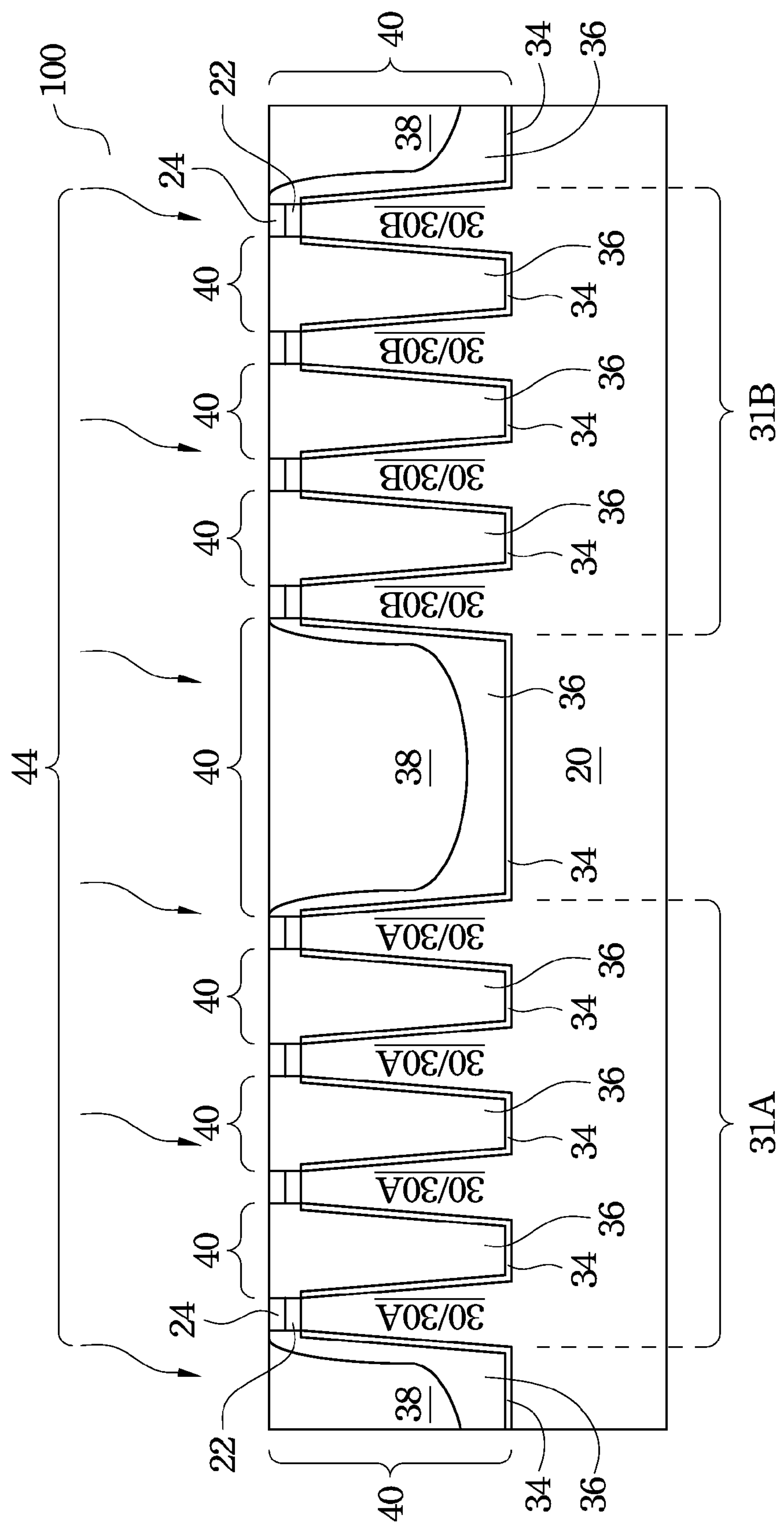

FIG. 8 illustrates the annealing of wafer 100, wherein the annealing is represented by arrows 44. In some embodiments, the annealing includes a wet anneal step, which is performed using In-Situ Steam Generation (ISSG), in which the steam of water is generated, and is driven through pad oxide layer 22, mask layer 24, and STI regions 40 to reach semiconductor strips 30. The anneal step may be performed at temperatures between about 800° C. and about 1,050° C. The duration of the ISSG may be between about 1 minute and about 20 minutes. In alternative embodiments, the oxidation may be performed using a dry anneal method, wherein the process gas my include an oxygen-containing gas such as $O_2$, $H_2$, $N_2$, or the like, and the temperature may be between about 200° C., and about 700° C. The duration of the dry anneal may be between about 30 minutes and about 120 minutes. In yet alternative embodiments, the anneal step includes the wet anneal step followed by the dry anneal step.

As a result of the anneal, the top portions and sidewall portions of semiconductor strips 30 are oxidized. The resulting oxides are not shown since they may comprise the same oxide as liner oxide layers 34. The volume of the resulting oxide is greater than the volume of the portions of semiconductor strips 30 that are oxidized. Accordingly, the total volume of semiconductor strips 30 and the resulting oxides is expanded over the volume of the semiconductor strips 30 before the oxidation. As a result, the shrinkage of dielectric material 36, as shown in FIG. 5, and the shrinkage of dielectric regions 38 in the anneal, are at least partially compensated for. The bended semiconductor strips 30 may thus be straightened, as shown in FIG. 8. In accordance with some embodiments, the process conditions of the annealing, such as the annealing time, the temperature of wafer 100, etc., may be adjusted, so that after the annealing in FIG. 9, the expansion of materials caused by the annealing substantially compensates for the shrinkage of dielectric regions 36 and 38, and hence semiconductor strips 30 may have vertical profiles. In addition, in the annealing, the quality of dielectric regions 36 and 38 is improved, and the difference between dielectric regions 36 and 38 may be reduced, and hence STI regions 40 may appear as homogeneous regions.

Figure 9:
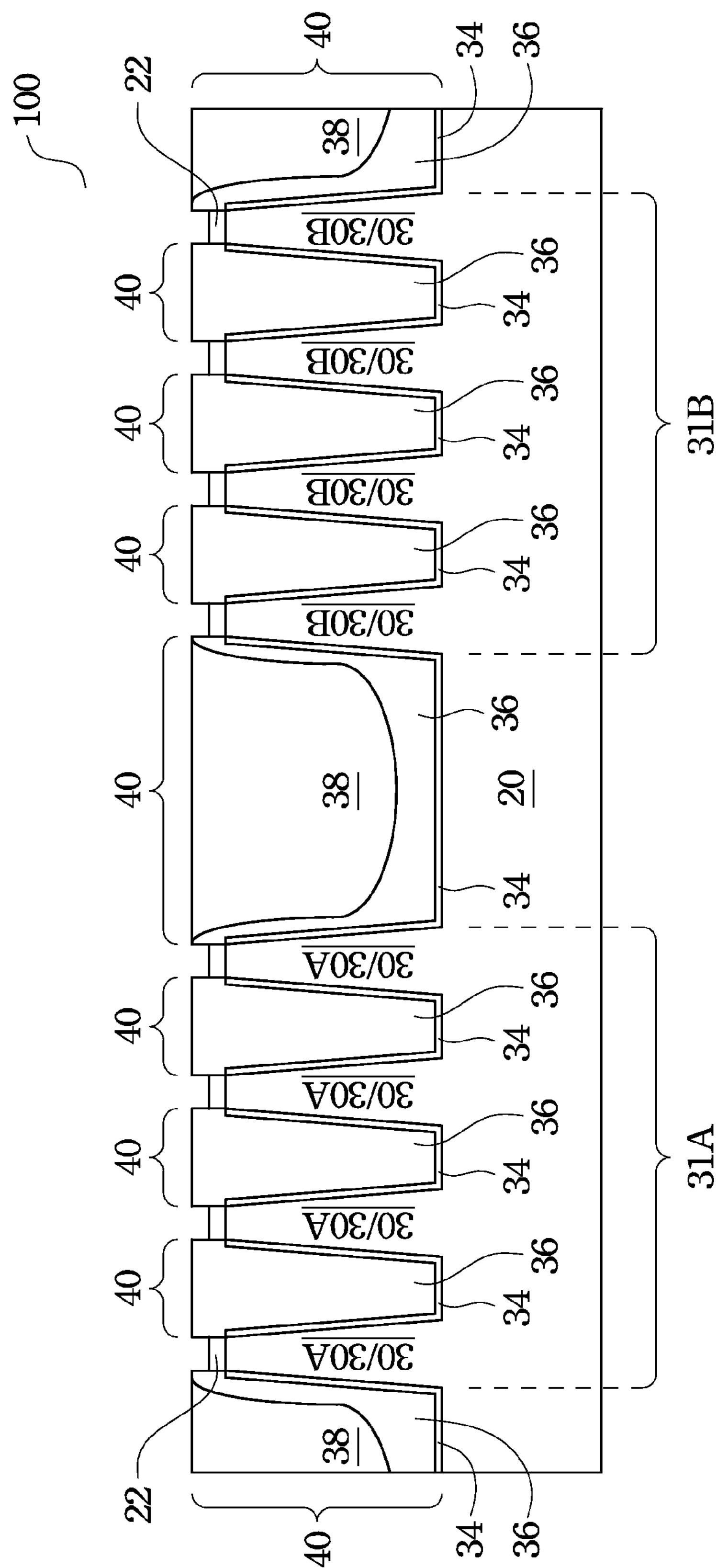
Figure 10:
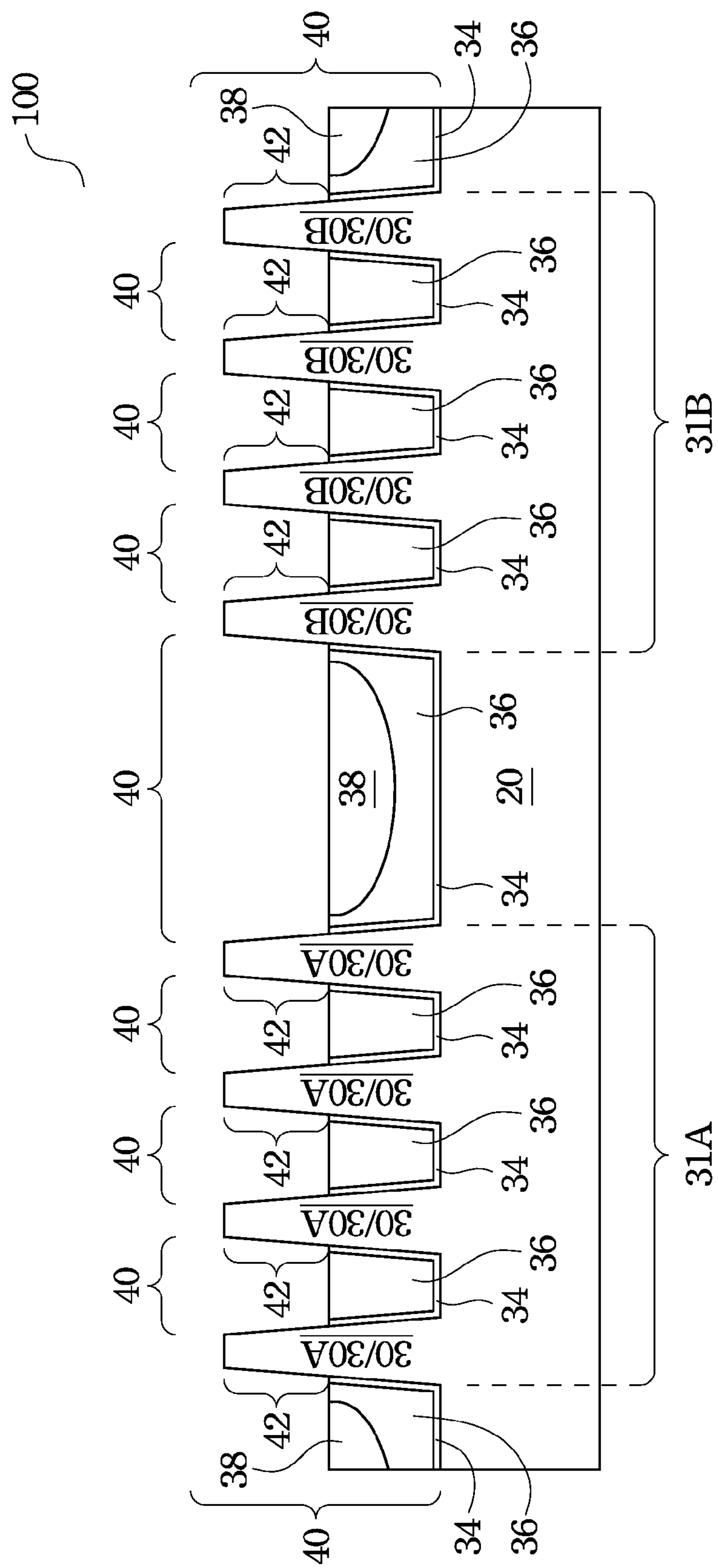

FIG. 9 illustrates the removal of mask layer 24. Mask layer 24, if formed of silicon nitride, may be removed by a wet process using hot $H_3PO_4$. Next, the structure shown in FIG. 9 is used to form semiconductor fins through the recessing of STI regions 40. Pad layer 22 is also removed. STI regions 40 are recessed by an etching step, as shown in FIG. 10. Referring to FIG. 10, the portions of semiconductor strips 30 protruding over the top surfaces of the remaining STI regions 40 become semiconductor fins 42. The recessing of STI regions 40 may be performed using a dry etch process or a wet etch process. In some embodiments, the recessing of STI regions 40 is performed using a dry etch method, in which the process gases including $NH_3$ and HF are used. In alternative embodiments, the recessing of STI regions 40 is performed using a wet etch method, in which the etchant solution includes $NF_3$ and HF. In yet other embodiments, the recessing of STI regions 40 is performed using a dilution HF solution, which may have an HF concentration lower than about 1 percent.

Figure 11:
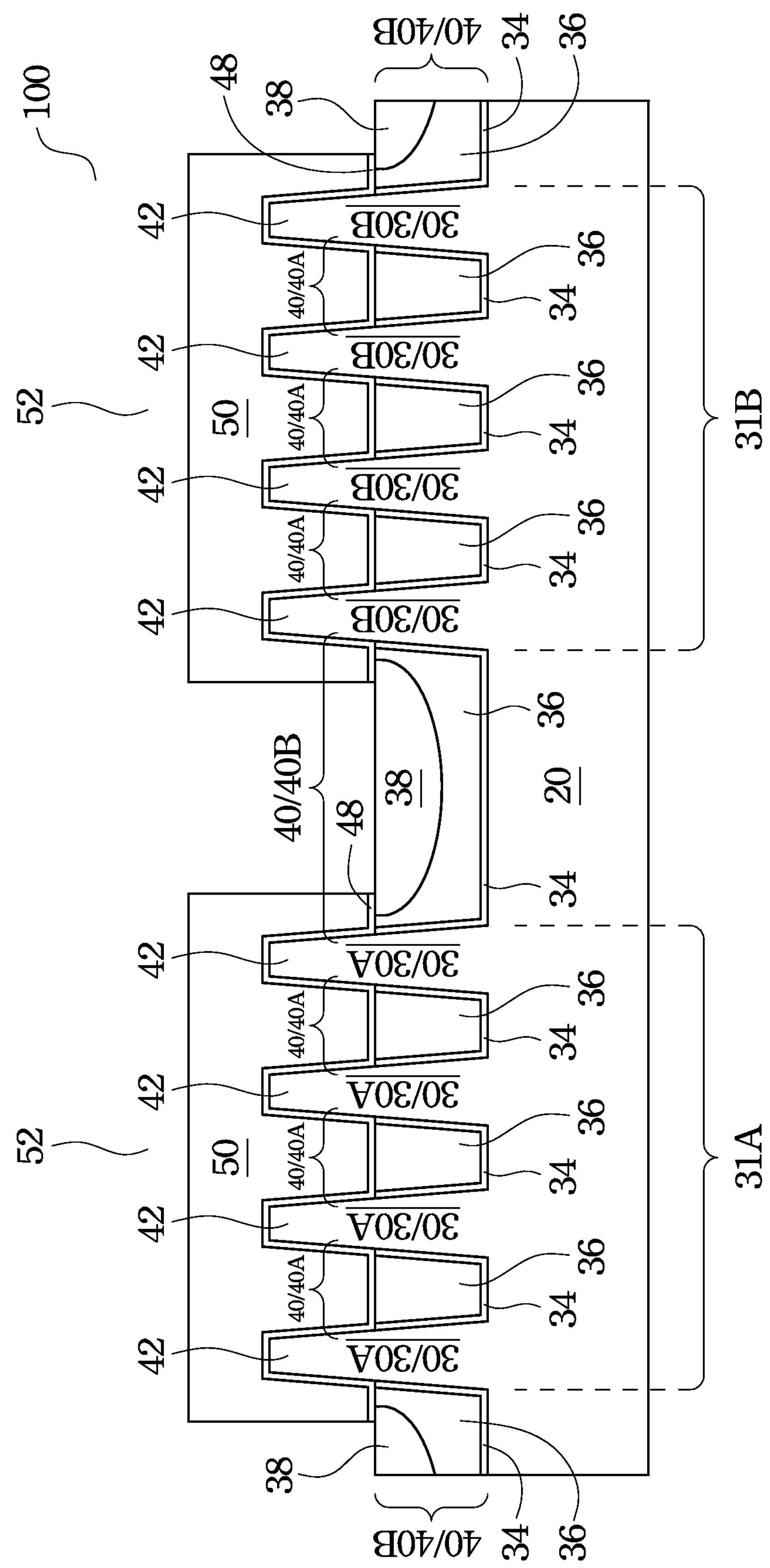

FIG. 11 illustrates FinFETs 52 formed from the structures shown in FIG. 10. In accordance with some exemplary embodiments, gate dielectrics 48 are formed to cover the top surfaces and sidewalls of fins 42. Gate dielectrics 48 may be formed through a thermal oxidation, and hence may include thermal silicon oxide. Alternatively, gate dielectrics 48 may be formed through a deposition step, and may comprise high-k dielectric materials. Gate electrodes 50 are then formed on gate dielectrics 48. In some embodiments, each of gate electrodes 50 covers fins 42 that belong to one of the strip groups 31A and 31B, and each of the resulting FinFETs 52 comprises more than one fin 42. The remaining components of FinFETs 52, including source and drain regions and source and drain silicides (not shown), are then formed. The formation processes of these components are known in the art, and hence are not repeated herein. Gate dielectrics 48 and gate electrodes 50 may be formed using a gate-first approach or a gate last approach. The details of the gate-first approach or a gate last approach are not described herein.

As shown in FIG. 11, there are two types of STI regions 40. The STI regions 40A that are underlying gate electrode 50 include dielectric regions 36, and are free from dielectric regions 38. The STI regions 40B, which are wider than STI regions 40A, and may be the STI regions 40B separating FinFETs, may include both dielectric regions 36 and 38. In STI regions 40B, dielectric regions 36 and 38 may be formed of the same dielectric material, or may be formed of different dielectric materials. In one of STI regions 40B, dielectric region 38 is encircled by dielectric region 36, and is further over a bottom portion of dielectric region 36. Depending on the materials, dielectrics regions 36 and 38 may, or may not, have distinguishable interfaces.

In the embodiments of the present disclosure, by applying a first dielectric material to fill narrow trenches, while leaving some portions of wide trenches unfilled, the shrinkage of the first dielectric material has a smaller effect to bend the semiconductor fins. The remaining portions of the trenches may then be filled using a low-shrinkage-rate material. As a result, substantially un-bended semiconductor fins may be formed.

In accordance with some embodiments, a method includes forming a plurality of trenches extending from a top surface of a semiconductor substrate into the semiconductor substrate, with semiconductor strips formed between the plurality of trenches. The plurality of trenches includes a first trench and second trench wider than the first trench. A first dielectric material is filled in the plurality of trenches, wherein the first trench is substantially fully filled, and the second trench is filled partially. A second dielectric material is formed over the first dielectric material. The second dielectric material fills an upper portion of the second trench, and has a shrinkage rate different from the first shrinkage rate of the first dielectric material. A planarization is performed to remove excess portions of the second dielectric material over the semiconductor substrate, wherein remaining portions of the first dielectric material and the second dielectric material form a first and a second STI region in the first and the second trenches, respectively.

In accordance with other embodiments, a method includes forming a plurality of trenches extending from a top surface of a semiconductor substrate into the semiconductor substrate, with semiconductor strips formed between the plurality of trenches. The plurality of trenches includes a first trench and second trench wider than the first trench. A first dielectric material is filled in the plurality of trenches, wherein the first trench is substantially fully filled, and the second trench is filled partially. An anneal is performed on the first dielectric material. After the first anneal, a second dielectric material is formed over the first dielectric material, wherein the second dielectric material fully fills the second trench. A planarization to remove excess portions of the second dielectric material over the semiconductor substrate. The remaining portions of the first dielectric material and the second dielectric material form Shallow STI regions.

In accordance with yet other embodiments, an integrated circuit structure includes a semiconductor substrate, a first and a second semiconductor strip over the semiconductor substrate, and a first STI region between and contacting the first and the second semiconductor strips. The first STI region includes a first dielectric region. A second STI region is over the semiconductor substrate. The second STI region includes a second dielectric region, and a third dielectric region encircled by the second dielectric region. The third dielectric region is further over a bottom portion of the second dielectric region. The first dielectric region and the second dielectric region are formed of a same dielectric material. The first STI region is free from dielectric regions formed of a same material as the third dielectric region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of manufacturing semiconductor fins and Fin Field Effect Transistors (FinFETs), the method comprising:

forming a plurality of trenches extending from a top surface of a semiconductor substrate into the semiconductor substrate, with semiconductor strips formed between the plurality of trenches, wherein the plurality of trenches comprises a first trench and second trench wider than the first trench;

filling a first dielectric material in the plurality of trenches, wherein the first trench is substantially fully filled, and the second trench is filled partially, and wherein the first dielectric material has a first shrinkage rate;

forming a second dielectric material over the first dielectric material, wherein the second dielectric material fills an upper portion of the second trench, and wherein the second dielectric material has a second shrinkage rate different from the first shrinkage rate; and performing a planarization to remove excess portions of the second dielectric material over the semiconductor substrate, wherein remaining portions of the first dielectric material and the second dielectric material form a first and a second Shallow Trench Isolation (STI) regions in the first and the second trenches, respectively.

2. The method of claim 1, wherein the first shrinkage rate is greater than the second shrinkage rate.

3. The method of claim 1 further comprising, after the step of filling the first dielectric material and before forming the second dielectric material, performing an anneal on the first dielectric material.

4. The method of claim 1 further comprising, after the planarization, performing an annealing, wherein the semiconductor strips between the plurality of trenches are partially oxidized to have a volume expansion, and wherein the volume expansion substantially compensates for a shrinkage of the first and the second dielectric materials.

5. The method of claim 1, wherein the first dielectric material is flowable when filled, and the second dielectric material is non-flowable when formed.

6. The method of claim 1 further comprising, after the planarization:

recessing the first and the second dielectric materials to form recesses, wherein portions of the semiconductor strips over top surfaces of remaining portions of the first and the second dielectric materials form semiconductor fins, wherein after the step of recessing, the STI region comprises the first dielectric material, and is free from the second dielectric material, and the second STI region comprises the first and the second dielectric materials.

7. The method of claim 6 further comprising:

forming a gate dielectric on sidewalls and top surface of the semiconductor fins; and forming a gate electrode over the gate dielectric.

8. A method of manufacturing semiconductor fins and Fin Field Effect Transistors (FinFETs), the method comprising:

forming a plurality of trenches extending from a top surface of a semiconductor substrate into the semiconductor substrate, with semiconductor strips formed between the plurality of trenches, wherein the plurality of trenches comprises a first trench and second trench wider than the first trench;

filling a first dielectric material in the plurality of trenches, wherein the first trench is substantially fully filled, and the second trench is filled partially;

performing a first anneal on the first dielectric material;

after the first anneal, filling a second dielectric material over the first dielectric material, wherein the second dielectric material fully fills the second trench; and performing a planarization to remove excess portions of the second dielectric material over the semiconductor substrate, wherein remaining portions of the first dielectric material and the second dielectric material form Shallow Trench Isolation (STI) regions.

9. The method of claim 8, wherein the first dielectric material and the second dielectric material are different from each other.

10. The method of claim 9, wherein the first dielectric material has a first shrinkage rate, and wherein the second dielectric material has a second shrinkage rate smaller than the first shrinkage rate.

11. The method of claim 8 further comprising, after the planarization, performing a second anneal, wherein the semiconductor strips are partially oxidized.

12. The method of claim 11, wherein after the first anneal and before the step of filling the second dielectric material, the semiconductor strips are bended, and wherein after the second anneal, the semiconductor strips are substantially straightened.

13. The method of claim 8, wherein the first dielectric material is flowable when filled, and the second dielectric material is non-flowable when filled.

14. The method of claim 8, further comprising, after the planarization:

recessing the first and the second dielectric materials to form recesses, wherein portions of the semiconductor strips over top surfaces of remaining portions of the first and the second dielectric materials form semiconductor fins, and wherein after recessing, a first one of the STI regions in the first trench comprises the first dielectric material, and is free from the second dielectric material, and a second one of the STI regions in the second trench comprises the first and the second dielectric materials.

15. The method of claim 14, further comprising:

forming a gate dielectric on sidewalls and top surface of the semiconductor fins; and forming a gate electrode over the gate dielectric.

16. A method of making semiconductor strips and Shallow Trench Isolation (STI) regions, the method comprising:

etching a semiconductor substrate to form a plurality of trenches in the semiconductor substrate;

filling a first dielectric material into the plurality of trenches;

solidifying the first dielectric material;

filling a second dielectric material into the plurality of trenches after the solidifying the first dielectric material;

solidifying the second dielectric material; and performing a planarization to remove excess portions of the second dielectric material, wherein remaining portions of the first dielectric material and the second dielectric material form Shallow Trench Isolation (STI) regions in the plurality of trenches.

17. The method of claim 16, wherein a first one of the plurality of trenches is substantially fully filled by the first dielectric material, and wherein a second one of the plurality of trenches is filled with the first dielectric material and the second dielectric material.

18. The method of claim 17, wherein the first one of the plurality of trenches is narrower than the second one of the plurality of trenches.

19. The method of claim 16, wherein after the solidifying the first dielectric material and before the filling the second dielectric material, semiconductor strips between the plurality of trenches are bended, and wherein after the solidifying the second dielectric material, the semiconductor strips are substantially straightened.

20. The method of claim 16, wherein the first dielectric material is flowable when filled, and the second dielectric material is non-flowable when filled.

* * * * *